US008629457B2

United States Patent
Nishiguchi et al.

(10) Patent No.: US 8,629,457 B2
(45) Date of Patent: Jan. 14, 2014

(54) LIGHT-EMITTING DEVICE

(75) Inventors: Taro Nishiguchi, Itami (JP); Makoto Sasaki, Itami (JP); Shin Harada, Osaka (JP); Kyoko Okita, Itami (JP); Hiroki Inoue, Itami (JP); Shinsuke Fujiwara, Itami (JP); Yasuo Namikawa, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 213 days.

(21) Appl. No.: 13/005,719

(22) Filed: Jan. 13, 2011

(65) Prior Publication Data

US 2011/0175108 A1    Jul. 21, 2011

(30) Foreign Application Priority Data

Jan. 15, 2010    (JP) .................................. 2010-006773

(51) Int. Cl.
*H01L 33/18*    (2010.01)

(52) U.S. Cl.
USPC ..................................... 257/77; 257/E33.003

(58) Field of Classification Search
USPC ............................................. 257/77, E33.003
See application file for complete search history.

(56) References Cited

U.S. PATENT DOCUMENTS

| 2002/0121642 | A1  | 9/2002 | Doverspike et al. |
| 2007/0105349 | A1* | 5/2007 | Hallin et al. ................. 438/478 |

FOREIGN PATENT DOCUMENTS

| JP | 9-214054   | 8/1997 |
| JP | 2002-527890 | 8/2002 |
| JP | 2008-74661 | 4/2008 |

* cited by examiner

*Primary Examiner* — Long Pham
(74) *Attorney, Agent, or Firm* — Drinker Biddle & Reath LLP

(57) ABSTRACT

A silicon carbide substrate has a first layer facing a semiconductor layer and a second layer stacked on the first layer. Dislocation density of the second layer is higher than dislocation density of the first layer. Thus, quantum efficiency and power efficiency of a light-emitting device can both be high.

9 Claims, 4 Drawing Sheets

LIGHT-EMITTING DEVICE

BACKGROUND OF THE INVENTION

1. Field of the Invention

The present invention relates to a light-emitting device and particularly to a light-emitting device including a semiconductor layer having a portion formed of a group III nitride semiconductor.

2. Description of the Background Art

A light-emitting diode representing a light-emitting device disclosed in Japanese National Patent Publication No. 2002-527890 has a group III nitride semiconductor layer on a silicon carbide substrate. This light-emitting diode is constructed as a vertical type by making use of conductivity of the silicon carbide substrate. In addition, since lattice unmatch between silicon carbide and a group III nitride semiconductor is small, a group III nitride semiconductor layer can be grown on the silicon carbide substrate with small strain, and consequently a high-performance light-emitting diode is obtained.

In order to enhance quantum efficiency of a light-emitting device, quality of the silicon carbide substrate on which a semiconductor layer is to be formed should be enhanced, and in particular dislocation density should be lowered. Here, dislocation density refers to the number of dislocations per substrate area. Examples of dislocation include basal plane dislocation, threading edge dislocation, threading screw dislocation, and mixed dislocation, or a hollow threading defect called micropipe.

In addition, in order to lower ON resistance for enhancing power efficiency of a vertical type light-emitting device, electric resistance originating from the silicon carbide substrate should be lowered. Though this resistance can be lowered by decreasing a thickness of the substrate, the thickness of the substrate cannot excessively be decreased in order to sufficiently ensure a function for the substrate to support the semiconductor layer. Therefore, in order to sufficiently lower this resistance, electrical resistivity of the silicon carbide substrate should be lowered.

As described above, in order to enhance both of quantum efficiency and power efficiency, dislocation density and electrical resistivity of the silicon carbide substrate should both be lowered. It is difficult, however, to achieve both of these in terms of physical property of silicon carbide, and hence it has been difficult to enhance both of quantum efficiency and power efficiency of a light-emitting device.

SUMMARY OF THE INVENTION

The present invention was made in view of the above-described problems, and an object of the present invention is to provide a light-emitting device high in both of quantum efficiency and power efficiency.

A light-emitting device according to the present invention has a semiconductor layer and a silicon carbide substrate. The semiconductor layer has first and second portions. The first portion is formed of a group III nitride semiconductor having a first conductive type. The second portion is formed of a group III nitride semiconductor having a second conductive type. The first and second portions form a junction for light emission originating from recombination of electrons and holes. The silicon carbide substrate supports the semiconductor layer and it is electrically connected to a side of the semiconductor layer including the first portion. The silicon carbide substrate includes a first layer facing the semiconductor layer and a second layer stacked on the first layer. The first and second layers have first and second dislocation densities, respectively, and the second dislocation density is higher than the first dislocation density.

According to the present invention, the silicon carbide substrate has the first layer relatively low in dislocation density and the second layer relatively high in dislocation density. As the semiconductor layer is formed on the first layer having low dislocation density, quality of the semiconductor layer is enhanced and thus quantum efficiency of the light-emitting device is enhanced. In addition, as the second layer is stacked on the first layer, the semiconductor layer can be supported more sufficiently than in a case where the second layer is not present. Moreover, since the second layer is higher in dislocation density than the first layer, the second layer is readily lower in electrical resistivity than the first layer, and hence electric resistance originating from the silicon carbide substrate is lowered. Thus, power efficiency of the light-emitting device is enhanced.

Preferably, the first and second layers have first and second impurity concentrations, respectively, and the second impurity concentration is higher than the first impurity concentration. Based on this difference in impurity concentration, the second layer can be lower in electrical resistivity than the first layer.

The light-emitting device preferably has an electrode on the second layer. Since the second layer on which the electrode is provided is low in electrical resistivity, contact resistance between the electrode and the second layer can be lowered. Thus, power efficiency of the light-emitting device can be improved.

Preferably, the first layer has a hexagonal crystal structure. Thus, a group III nitride semiconductor similarly having a hexagonal crystal structure can be grown on the first layer with high quality.

Preferably, the first layer has a plane facing the semiconductor layer and the plane has a {0001} plane orientation. Thus, a crystal orientation of a group III nitride semiconductor layer can be suitable for achieving high quantum efficiency.

As can clearly be understood from the description above, according to the light-emitting device of the present invention, a light-emitting device high in both of quantum efficiency and power efficiency can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

First Embodiment

Figure 1:
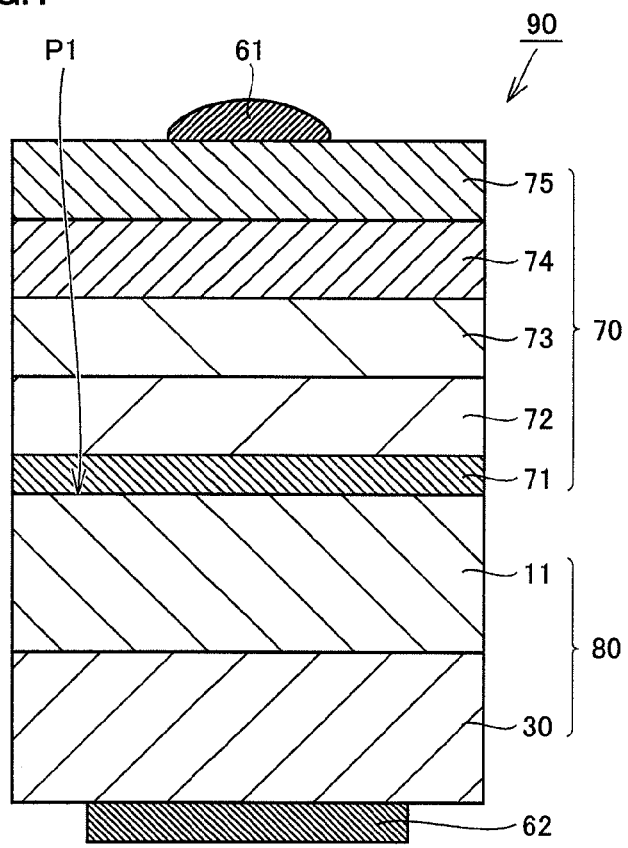
FIG. 1 is a cross-sectional view schematically showing a construction of a light-emitting device in a first embodiment of the present invention.

Referring to FIG. 1, a light-emitting device 90 according to the present embodiment is a vertical type light-emitting diode having a semiconductor layer 70, a silicon carbide substrate 80, and electrodes 61 and 62. Specifically, light-emitting device 90 is a device emitting light from semiconductor layer 70 as a result of application of a voltage across electrodes 61 and 62 provided to sandwich a stack constituted of semiconductor layer 70 and silicon carbide substrate 80.

Semiconductor layer 70 is formed of a gallium-nitride-based compound semiconductor which is a group III nitride semiconductor. Specifically, semiconductor layer 70 has a buffer layer 71, an n-type (first conductive type) barrier layer 72 (a first portion), an active layer 73, a p-type (a second conductive type) barrier layer 74 (a second portion), and a p-type contact layer 75, and these layers are sequentially stacked on silicon carbide substrate 80.

Active layer 73 is a high-purity layer (an i layer) lower in impurity concentration than each of n-type barrier layer 72 and p-type barrier layer 74. As n-type barrier layer 72 and p-type barrier layer 74 are arranged to sandwich active layer 73 (i layer), a pin structure is formed. In other words, n-type barrier layer 72 and p-type barrier layer 74 form a pn junction for light emission originating from recombination of electrons and holes through active layer 73, that is, with active layer 73 serving as a boundary.

Silicon carbide substrate 80 supports semiconductor layer 70. In addition, silicon carbide substrate 80 is electrically connected to n-type barrier layer 72 with conductive buffer layer 71 being interposed, and spaced apart from p-type barrier layer 74 by active layer 73. Namely, silicon carbide substrate 80 is electrically connected to a side of semiconductor layer 70 including n-type barrier layer 72 (a lower side in the drawing), with the pn junction above serving as a boundary.

Moreover, silicon carbide substrate 80 has a layer portion 11 (a first layer) and a base portion 30 (a second layer) each formed of n-type silicon carbide and stacked. Namely, silicon carbide substrate 80 has a front surface P1 and a back surface opposed to front surface P1, front surface P1 being formed by layer portion 11 and the back surface being formed by base portion 30.

Layer portion 11 has a single-crystal structure and it is a portion in silicon carbide substrate 80 particularly high in quality of crystal. Therefore, dislocation density of base portion 30 (second dislocation density) is higher than dislocation density of layer portion 11 (first dislocation density). In addition, impurity concentration in base portion 30 (second impurity concentration) is higher than impurity concentration in layer portion 11 (first impurity concentration). Owing to difference in this impurity concentration, base portion 30 can be lower in electrical resistivity than layer portion 11.

Electrode 62 is formed of a metal and arranged on base portion 30. Electrode 61 is formed of a metal and arranged on p-type contact layer 75.

Figure 2:
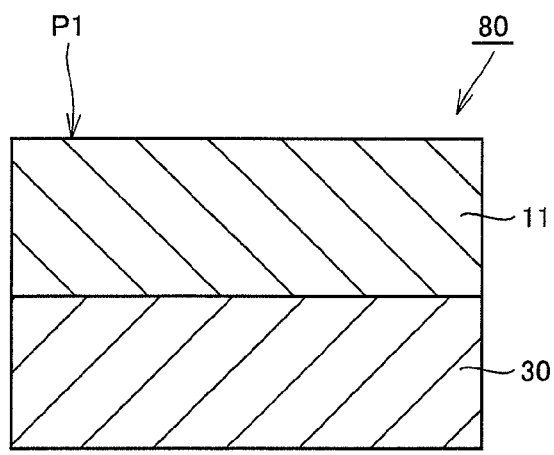
FIG. 2 is a cross-sectional view schematically showing one step in a method of manufacturing a light-emitting device in the first embodiment of the present invention.

A method of manufacturing light-emitting device 90 will now be described. Initially, silicon carbide substrate 80 (FIG. 2) is prepared. Since a method of manufacturing silicon carbide substrate 80 is substantially the same as a method of manufacturing a silicon carbide substrate 81 (FIG. 5) in a second embodiment which will be described later, description thereof will not be provided. Then, semiconductor layer 70 is deposited on front surface P1 (FIG. 2). Then, electrodes 61 and 62 are formed. Light-emitting device 90 (FIG. 1) is obtained as above.

Then, a light-emitting device 99 (FIG. 3) according to a comparative example will be described. Light-emitting device 99 has a silicon carbide substrate 89 instead of silicon carbide substrate 80 (FIG. 1). Unlike silicon carbide substrate 80 (FIG. 1), silicon carbide substrate 89 does not have a stack structure but it is formed substantially uniformly in its entirety.

In order to support semiconductor layer 70 likewise silicon carbide substrate 80, silicon carbide substrate 89 has a thickness (a dimension in a vertical direction in the drawing) as large as silicon carbide substrate 80. In addition, electrical resistivity of silicon carbide substrate 89 is set as high as average electrical resistivity of silicon carbide substrate 80 such that ON resistance of light-emitting device 99 is as high as ON resistance of light-emitting device 90 (FIG. 1). Consequently, since electrical resistivity of silicon carbide substrate 89 has a value intermediate between electrical resistivity of base portion 30 (FIG. 1) and electrical resistivity of layer portion 11, silicon carbide substrate 89 is lower in electrical resistivity than layer portion 11. Therefore, it is difficult to suppress dislocation density of silicon carbide substrate 89 to a level as low as dislocation density of layer portion 11, and consequently quality of semiconductor layer 70 formed on silicon carbide substrate 89 is lowered. Thus, light-emitting device 99 according to the present comparative example is lower in quantum efficiency than light-emitting device 90 according to the present embodiment.

If electrical resistivity of silicon carbide substrate 89 may be substantially equal to electrical resistivity of layer portion 11, high-quality silicon carbide substrate 89 with fewer dislocations can readily be prepared, and hence lowering in quantum efficiency above can be avoided. In this case, however, ON resistance becomes high and hence power efficiency is lowered.

Further, if silicon carbide substrate 89 may be similar in thickness to layer portion 11, lowering in quantum efficiency and power efficiency can be avoided. In this case, however, the substrate has too small a thickness and hence semiconductor layer 70 is not sufficiently supported.

According to the present embodiment, silicon carbide substrate 80 (FIG. 1) has layer portion 11 relatively low in dislocation density and base portion 30 relatively high in dislocation density. As semiconductor layer 70 is formed on layer portion 11 having low dislocation density, quality of semiconductor layer 70 is enhanced and in particular quality of active layer 73 is enhanced. Quantum efficiency of light-emitting device 90 is thus enhanced.

In addition, as base portion 30 is stacked on layer portion 11, semiconductor layer 70 can be supported more sufficiently than in a case where base portion 30 is not present. In order to sufficiently support the semiconductor layer, silicon carbide substrate 80 preferably has a thickness not smaller than 300 μm.

Moreover, base portion 30 is lower in light transmittance than layer portion 11 due to difference in impurity concentration. Therefore, if external quantum efficiency is particularly important, base portion 30 is preferably decreased in thickness and it preferably has a thickness, for example, not greater than 100 μm.

Further, since base portion 30 is higher in dislocation density than layer portion 11, it is easy to make electrical resistivity of base portion 30 lower than electrical resistivity of layer portion 11 by making impurity concentration in base portion 30 higher than impurity concentration in layer portion 11, and thus electric resistance originating from silicon carbide substrate 80 can be lowered. By thus lowering ON resistance of light-emitting device 90, power efficiency thereof is enhanced. Specifically, base portion 30 has impurity concentration preferably not lower than $5\times10^{18}$ cm$^{-3}$ and further preferably not lower than $1\times10^{20}$ cm$^{-3}$. The base portion preferably has electrical resistivity lower than 50 mΩ·cm and further preferably lower than 10 mΩ·cm.

In addition, layer portion 11 high in light transmitting characteristic, instead of base portion 30 low in light transmitting characteristic, is arranged close to semiconductor layer 70 serving as a light-emitting portion. Light from semiconductor layer 70 can thus efficiently be extracted. Namely, external quantum efficiency can be enhanced.

Moreover, since base portion 30 on which electrode 62 is provided has high impurity concentration and low electrical resistivity, contact resistance between electrode 62 and base portion 30 can be lowered. Power efficiency of light-emitting device 90 can thus be improved.

Further, silicon carbide substrate 80 is composed of silicon carbide and silicon carbide has thermal conductivity higher than other common materials for a substrate. Since heat generated in light-emitting device 90 is thus efficiently radiated, light-emitting device 90 is particularly suitable for applications requiring high output.

Preferably, layer portion 11 has a hexagonal crystal structure. Thus, semiconductor layer 70 similarly having a hexagonal crystal structure can be grown on layer portion 11 with high quality.

Front surface P1 is a planar surface and it has a {0001} plane orientation. Thus, crystal orientation of semiconductor layer 70 can be suitable for obtaining high-quality crystal.

Since layer portion 11 and base portion 30 are both formed of silicon carbide, difference in coefficient of thermal expansion therebetween is small. Therefore, crack of silicon carbide substrate 80 in the step of forming semiconductor layer 70 can be prevented. Difference in coefficient of thermal expansion can be made smaller by making layer portion 11 and base portion 30 have a common crystal structure, and it can be made further smaller by aligning crystal orientations of both of these.

Light emitted from light-emitting device 90 can be in any of a red portion, a green portion, a blue portion, a violet portion, and an ultraviolet portion in electromagnetic spectra. For example, a GaN layer or an AlGaN layer can be employed for buffer layer 71. N-type barrier layer 72 has a thickness preferably from 2 to 20 μm and further preferably from 4 to 10 μm. Layer portion 11 has a plane orientation preferably in substantially {0001}, and specifically, an off angle from {0001} is preferably within 1°.

In the construction above, the p-type and the n-type may be interchanged. In addition, though a device structure is vertical in the present embodiment, a horizontal device structure may be employed unless particularly high external quantum efficiency is demanded. Namely, such a structure that both of an anode electrode and a cathode electrode are arranged on the side of front surface P1 of silicon carbide substrate 80 may be employed.

Second Embodiment

Figure 4:
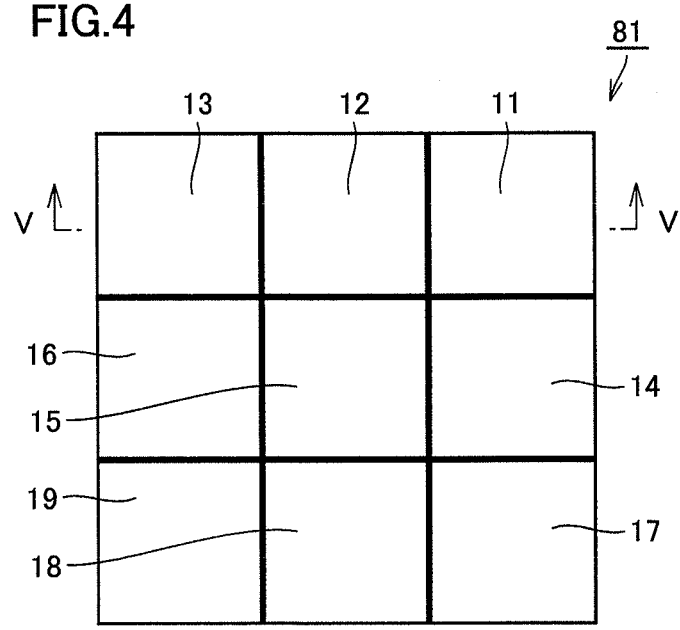
FIG. 4 is a plan view schematically showing one step in a method of manufacturing a light-emitting device in a second embodiment of the present invention.
Figure 5:
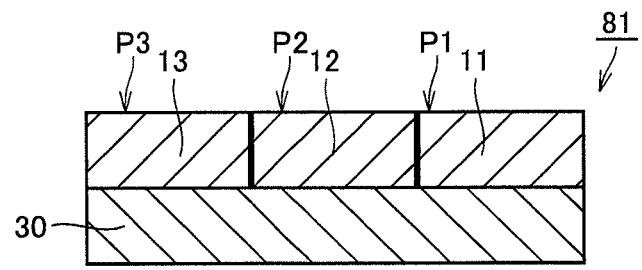
FIG. 5 is a schematic cross-sectional view along the line V-V in FIG. 4.

Referring mainly to FIGS. 4 and 5, in the present embodiment, light-emitting device 90 is manufactured by using silicon carbide substrate 81 instead of silicon carbide substrate 80 (FIG. 2) in the first embodiment. Unlike the first embodiment, silicon carbide substrate 81 has a plurality of layer portions 11 to 19. Each of layer portions 12 to 19 is similar in construction to layer portion 11 described above. Each of layer portions 11 to 19 is stacked on base portion 30. A method of manufacturing silicon carbide substrate 81 will be described below.

Figure 6:
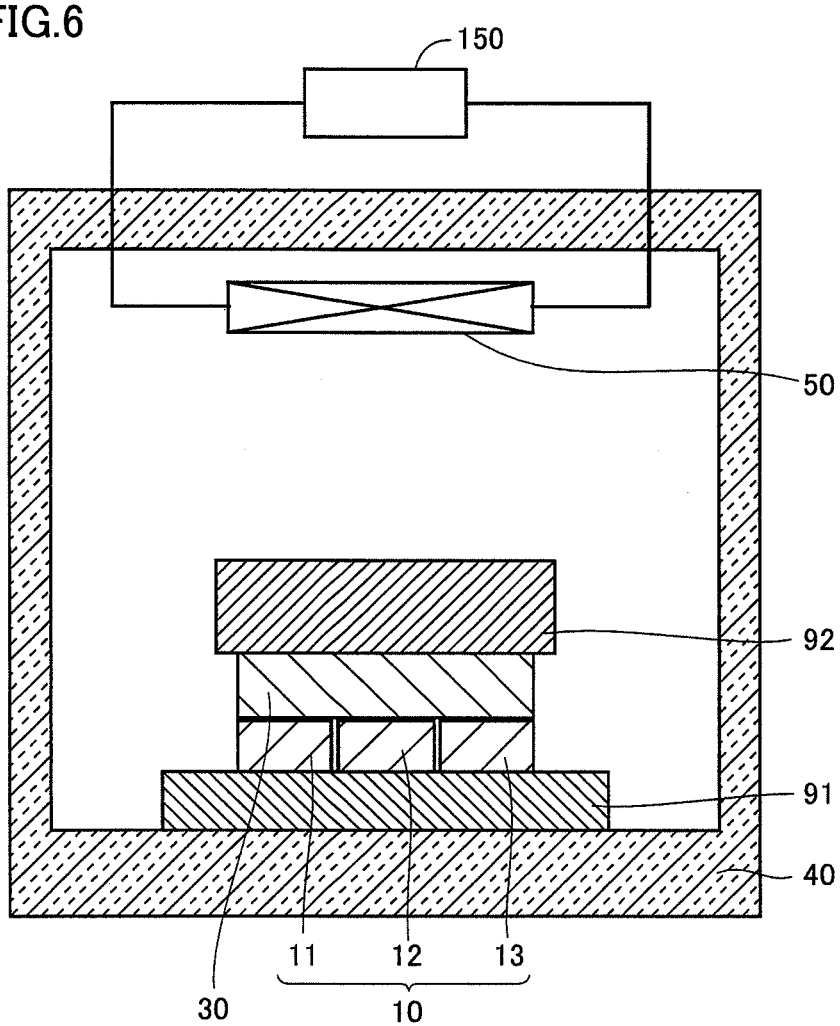
FIG. 6 is a cross-sectional view schematically showing one step in a method of manufacturing a silicon carbide substrate for the light-emitting device in the second embodiment of the present invention.

Referring to FIG. 6, base portion 30 and each of layer portions 11 to 19 (collectively also referred to as a group of layer portions 10) are prepared. Each layer portion in prepared group of layer portions 10 is a single-crystal silicon carbide substrate. Prepared base portion 30 is not limited to one made of single crystal and it may be polycrystalline or may be made of a sintered object. In the case of single crystal, base portion 30 may be higher in dislocation density than group of layer portions 10. Thus, it is not necessary to employ high-quality single crystal for base portion 30 as in the case of layer portions 11 to 19, and a base portion larger than each of layer portions 11 to 19 can readily be prepared. For example, in an example where the base portion has a circular shape, it has a diameter preferably not smaller than 5 cm and further preferably not smaller than 15 cm.

In addition, a heating apparatus having first and second heating elements 91 and 92, a heat-insulating vessel 40, a heater 50, and a heater power supply 150 is prepared. Heat-insulating vessel 40 is formed of a highly heat-insulating material. Heater 50 is, for example, an electric resistance heater. First and second heating elements 91 and 92 have a function to heat base portion 30 and group of layer portions 10 by radiating again heat obtained as a result of absorption of radiant heat from heater 50. First and second heating elements 91 and 92 are formed, for example, of graphite having low porosity.

Then, first heating element 91, group of layer portions 10, base portion 30, and second heating element 92 are arranged in a stacked manner in this order. Specifically, initially on first heating element 91, layer portions 11 to 19 are arranged in matrix. Then, base portion 30 is placed on a surface of group of layer portions 10. Then, second heating element 92 is placed on base portion 30. Then, first heating element 91, group of layer portions 10, base portion 30, and second heating element 92 that are stacked are accommodated in heat-insulating vessel 40 in which heater 50 is provided.

Then, an atmosphere in heat-insulating vessel 40 is set to an inert gas atmosphere. For example, a noble gas such as He or Ar, a nitrogen gas, or a gas mixture of a noble gas and a nitrogen gas can be employed as the inert gas. In addition, a pressure in heat-insulating vessel 40 is set preferably to 50 kPa or lower and further preferably to 10 kPa or lower.

Then, heater 50 heats group of layer portions 10 and base portion 30 to such a temperature as causing sublimation recrystallization reaction through each of first and second heating elements 91 and 92. Heating is performed so as to produce such a temperature difference that a temperature of base portion 30 is higher than a temperature of group of layer portions 10. This temperature difference can be produced, for example, by arranging heater 50 nearer to second heating element 92 than to first heating element 91, as shown in FIG. 6.

When the temperature of base portion 30 is higher than the temperature of each layer portion in group of layer portions 10 as described above, mass transfer due to sublimation recrystallization from base portion 30 toward group of layer portions 10 is caused in a small gap between each layer portion in group of layer portions 10 and base portion 30. Thus, each layer portion in group of layer portions 10 and base portion 30 are joined to each other. A crystal structure of base portion 30 changes to a structure corresponding to a crystal structure of group of layer portions 10, as sublimation of base portion 30 and recrystallization thereof on group of layer portions 10 proceed. For example, even through initially prepared base portion 30 had a polycrystalline structure, a crystal structure of base portion 30 that has been joined to group of layer portions 10 may be a single-crystal structure. It is noted that quality of single crystal of this base portion 30 is lower than quality of group of layer portions 10 and single crystal of base portion 30 is higher in dislocation density than each of layer portions 11 to 19.

Preferably, a gas containing nitrogen is employed as an inert gas to be introduced in heat-insulating vessel 40. Nitrogen atoms are taken into base portion 30 in a process of sublimation and recrystallization above. Consequently, concentration of an n-type impurity in base portion 30 of silicon carbide substrate 81 becomes higher.

It is noted that silicon carbide substrate 80 (FIG. 2) is obtained if layer portion 11 alone is used instead of layer portions 11 to 19 as above.

According to the present embodiment, light-emitting device 90 (FIG. 1) can be manufactured by employing silicon carbide substrate 81 (FIG. 5) having a surface larger than front surface P1 of silicon carbide substrate 80 (FIG. 2). By employing a larger substrate, a step involved with a substrate can be performed on a larger number of light-emitting devices 90. Therefore, light-emitting device 90 can more efficiently be manufactured.

In addition, though prepared base portion 30 is larger in area than each of layer portions 11 to 19, it is higher in dislocation density, that is, lower in crystal quality, and hence it can readily be prepared.

Moreover, impurity concentration in each of base portion 30 and each of layer portions 11 to 19 can independently be controlled by introducing an impurity in at least any of base portion 30 and each of layer portions 11 to 19 before joint between base portion 30 and each of layer portions 11 to 19.

Further, impurity concentration in base portion 30 can be raised simultaneously with the joint step by introducing atoms in an atmosphere into base portion 30 in carrying out joint above. These atoms may be, for example, nitrogen atoms.

It is noted that variation in an in-plane thickness of base portion 30 and each of layer portions 11 to 19 prepared for manufacturing silicon carbide substrate 81 is preferably less and this variation is preferably less than 10 μm.

Further, silicon carbide substrate 81 preferably has a shape in conformity with SEMI (Semiconductor Equipment and Materials International) standard. According to this standard, in a case of a diameter of 150 mm (6 inches), a thickness is set to 0.625 mm, in a case of a diameter of 200 mm (8 inches), a thickness is set to 0.725 mm, in a case of a diameter of 300 mm (12 inches), a thickness is set to 0.775 mm, and tolerance of a thickness is set to ±0.025 mm.

EXAMPLE

Example

A polycrystalline silicon carbide substrate having a circular shape was prepared as base portion 30 (FIG. 2), which had a diameter of 5 cm, a thickness of 100 μm, an n conductive type, and impurity concentration of $1 \times 10^{20}$ cm$^{-3}$. In addition, a circular single-crystal silicon carbide substrate was prepared as layer portion 11 (FIG. 2), which had a diameter of 5 cm, a thickness of 300 μm, an n conductive type, impurity concentration of $5 \times 10^{16}$ cm$^{-3}$, a polytype of 6H, an off angle from the (0001) plane representing the plane orientation smaller than 0.1 degrees, and dislocation density of $1 \times 10^{4}$ cm$^{-2}$.

Then, after base portion 30 and layer portion 11 were stacked, base portion 30 and layer portion 11 were subjected to heat treatment. The atmosphere was set to a nitrogen atmosphere, the pressure was set to 1 Pa, and a treatment time was set to 24 hours. In addition, a treatment temperature was set to approximately 2100° C. During this heat treatment, such a temperature difference that, relatively, a temperature of base portion 30 is high and a temperature of layer portion 11 is low was produced. Namely, a temperature gradient was formed between base portion 30 and layer portion 11. As a result of this heat treatment, silicon carbide substrate 80 having layer portion 11 and base portion 30 joined to each other was obtained.

The crystal structure of base portion 30 joined to layer portion 11 changed from the polycrystalline structure to the crystal structure corresponding to the crystal structure of layer portion 11 through epitaxial growth caused by sublimation recrystallization in the heat treatment above. Namely, base portion 30 after heat treatment had a polytype of 6H and a plane orientation of (0001). In addition, impurity concentration in base portion 30 joined to layer portion 11 increased from $1 \times 10^{20}$ cm$^{-3}$, which is a value before joint, to $5 \times 10^{20}$ cm$^{-3}$. Moreover, base portion 30 had dislocation density of $1 \times 10^{5}$ cm$^{-2}$ and layer portion 11 had dislocation density of $1 \times 10^{4}$ cm$^{-2}$.

Then, a gallium-nitride-based compound semiconductor layer serving as semiconductor layer 70 which is a light-emitting element was formed on layer portion 11 with metal organic chemical vapor deposition (MOCVD). Specifically, the following steps were performed.

Initially, a conductive GaN layer having a thickness of 30 nm was formed as buffer layer 71 (FIG. 1). A temperature for growing the GaN layer was set to 550° C., which is a relatively low temperature as a growth temperature in MOCVD. Then, an Si-doped GaN layer having a thickness of 4 μm was formed as n-type barrier layer 72. A growth temperature was set to approximately 1000° C. Then, an undope In$_{0.2}$Ga$_{0.8}$N well layer having a thickness of 3 nm was formed as active layer 73. A growth temperature was set to approximately 800° C. Active layer 73 had dislocation density of $5 \times 10^{6}$ cm$^{-2}$.

Then, an Mg-doped Al$_{0.2}$Ga$_{0.8}$N layer having a thickness of 100 nm was formed as p-type barrier layer 74. A growth temperature was set to approximately 1000° C. Then, an Mg-doped GaN layer having a thickness of 1 μm was formed as p-type contact layer 75. Then, in order to activate doped Mg, heat treatment in a nitrogen atmosphere was performed at 700° C. for 30 minutes.

Then, an Ni/Au layer was formed as electrode 61 and an Ni layer was formed as electrode 62. Here, patterning with a photolithography technique using a contact aligner and heat treatment for alloying were performed.

Then, a structure obtained in the step involved with a substrate described above was divided into a plurality of 250×250 μm chips. By molding each chip, a light-emitting diode was obtained. External quantum efficiency of this light-emitting diode was measured with an integrating sphere and it was 15%.

An experiment the same as above was conducted, in which a thickness of base portion 30 was changed from 100 μm to 300 μm and a thickness of layer portion 11 was changed from 300 μm to 100 μm. Here, external quantum efficiency was 14%.

Comparative Example 5

Figure 3:
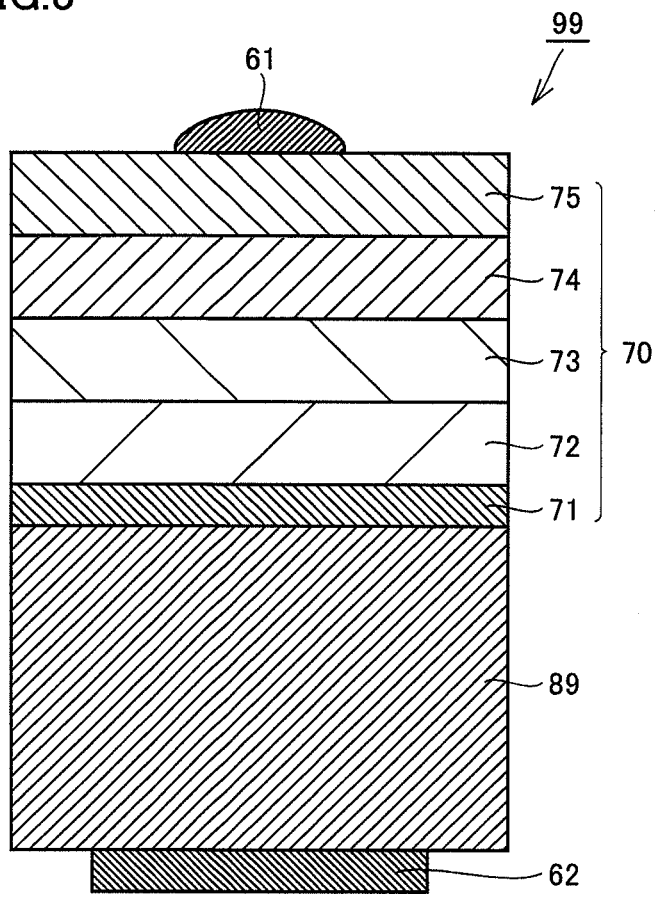
FIG. 3 is a cross-sectional view showing a construction of a light-emitting device in a comparative example.

A single-crystal silicon carbide substrate was prepared as silicon carbide substrate 89 (FIG. 3). The substrate had a diameter of 5 cm, a thickness of 400 μm, an n conductive type, concentration of an impurity, which is nitrogen, of $1 \times 10^{19}$ cm$^{-3}$, a polytype of 6H, an off angle from the (0001) plane representing the plane orientation smaller than 0.1 degrees, dislocation density of $5 \times 10^4$ cm$^{-2}$, and electrical resistivity of 20 mΩ·cm.

Then, a light-emitting diode was manufactured with the method the same as in the Example above. Active layer 73 then formed had dislocation density of $3 \times 10^7$ cm$^{-2}$. In addition, external quantum efficiency was 10%.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light-emitting device, comprising:
   a semiconductor layer including a first portion formed of a group III nitride semiconductor having a first conductive type and a second portion formed of a group III nitride semiconductor having a second conductive type, said first and second portions forming a junction for light emission originating from recombination of electrons and holes; and
   a silicon carbide substrate for supporting said semiconductor layer, electrically connected to a side of said semiconductor layer including said first portion, said silicon carbide substrate including a first layer facing said semiconductor layer and a second layer stacked on said first layer, said first and second layers having first and second dislocation densities, respectively, and said second dislocation density is higher than said first dislocation density,
   wherein
   said first and second layers have first and second impurity concentrations, respectively, and said second impurity concentration is higher than said first impurity concentration.

2. The light-emitting device according to claim 1, further comprising an electrode on said second layer.

3. A light-emitting device, comprising:
   a semiconductor layer including a first portion formed of a group III nitride semiconductor having a first conductive type and a second portion formed of a group III nitride semiconductor having a second conductive type, said first and second portions forming a junction for light emission originating from recombination of electrons and holes; and
   a silicon carbide substrate for supporting said semiconductor layer, electrically connected to a side of said semiconductor layer including said first portion, said silicon carbide substrate including a first layer facing said semiconductor layer and a second layer stacked on said first layer, said first and second layers having first and second dislocation densities, respectively, and said second dislocation density is higher than said first dislocation density,
   wherein
   said first layer has a hexagonal crystal structure.

4. A light-emitting device, comprising:
   a semiconductor layer including a first portion formed of a group III nitride semiconductor having a first conductive type and a second portion formed of a group III nitride semiconductor having a second conductive type, said first and second portions forming a junction for light emission originating from recombination of electrons and holes; and
   a silicon carbide substrate for supporting said semiconductor layer, electrically connected to a side of said semiconductor layer including said first portion, said silicon carbide substrate including a first layer facing said semiconductor layer and a second layer stacked on said first layer, said first and second layers having first and second dislocation densities, respectively, and said second dislocation density is higher than said first dislocation density,
   wherein
   said first layer has a plane facing said semiconductor layer and said plane has a {0001} plane orientation.

5. The light-emitting device according to claim 1, wherein a total thickness of the first and second layers is not smaller than 300 μm and not larger than 800 μm.

6. The light-emitting device according to claim 3, further comprising an electrode on said second layer.

7. The light-emitting device according to claim 3, wherein a total thickness of the first and second layers is not smaller than 300 μm and not larger than 800 μm.

8. The light-emitting device according to claim 4, further comprising an electrode on said second layer.

9. The light-emitting device according to claim 4, wherein a total thickness of the first and second layers is not smaller than 300 μm and not larger than 800 μm.

* * * * *